United States Patent
Hong et al.

(10) Patent No.: US 11,038,480 B2
(45) Date of Patent: Jun. 15, 2021

(54) AMPLIFIER

(71) Applicants: SAMSUNG ELECTRONICS CO., LTD., Suwon-si (KR); KOREA ADVANCED INSTITUTE OF SCIENCE AND TECHNOLOGY, Daejeon (KR)

(72) Inventors: Hyeokki Hong, Suwon-si (KR); Ji-Hun Lee, Daejeon (KR); Gyu-Hyeong Cho, Daejeon (KR); Cheheung Kim, Yongin-si (KR); Hyunwook Kang, Hwaseong-si (KR)

(73) Assignees: SAMSUNG ELECTRONICS CO., LTD., Suwon-si (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 0 days.

(21) Appl. No.: 16/791,728

(22) Filed: Feb. 14, 2020

(65) Prior Publication Data

US 2021/0036672 A1 Feb. 4, 2021

(30) Foreign Application Priority Data

Jul. 30, 2019 (KR) .......................... 10-2019-0092654

(51) Int. Cl.
*H03F 3/45* (2006.01)
*H03F 1/02* (2006.01)

(52) U.S. Cl.
CPC ....... *H03F 3/45269* (2013.01); *H03F 1/0205* (2013.01)

(58) Field of Classification Search
CPC ................................................... H03F 3/4526
See application file for complete search history.

(56) References Cited

U.S. PATENT DOCUMENTS

| 5,515,003 A | 5/1996 | Kimura |
| 5,994,939 A * | 11/1999 | Johnson ............... H03H 11/265 |
| | | 327/280 |

(Continued)

FOREIGN PATENT DOCUMENTS

| EP | 3263025 A1 | 1/2018 |
| KR | 1020190027315 A | 3/2019 |

OTHER PUBLICATIONS

Jovanov, E., et al., "A wireless body area network of intelligent motion sensors for computer assisted physical rehabilitation", Journal of NeuroEngineering and Rehabilitation, vol. 2, No. 6, Mar. 1, 2005, pp. 1-10.

(Continued)

*Primary Examiner* — Patricia T Nguyen
(74) *Attorney, Agent, or Firm* — Sughrue Mion, PLLC

(57) ABSTRACT

An amplifier includes: a first input transistor connected to a first input, a first output, and a power source or a ground, a second input transistor connected to a second input, a second output, and the power source or the ground; a first replica transistor connected to the first input, a detection node, and the power source or the ground; a second replica transistor connected to the second input, the detection node, and the power source or the ground; and a bias transistor connected to a bias voltage, the detection node, and the power source or the ground.

20 Claims, 5 Drawing Sheets

(56) References Cited

U.S. PATENT DOCUMENTS

| | | | |
|---|---|---|---|
| 6,138,000 A * | 10/2000 | Navid | H03D 7/1425 455/326 |
| 6,590,452 B1 | 7/2003 | van Rhijn | |
| 7,301,401 B2 | 11/2007 | Pennock | |
| 7,317,356 B2 | 1/2008 | Ananth | |
| 7,973,596 B2 | 7/2011 | Eschauzier et al. | |
| 8,604,879 B2 | 12/2013 | Mourant et al. | |
| 9,608,580 B2 | 3/2017 | Ko et al. | |
| 10,594,278 B2 | 3/2020 | Tripathi | |
| 2006/0250185 A1 * | 11/2006 | Sanduleanu | H03F 1/08 330/253 |
| 2007/0164817 A1 * | 7/2007 | Randall | H03F 3/45085 330/107 |
| 2008/0143441 A1 | 6/2008 | Naito | |
| 2008/0284514 A1 * | 11/2008 | Carroll | H03F 3/45278 330/261 |
| 2009/0251217 A1 | 10/2009 | Keerti | |
| 2010/0052778 A1 * | 3/2010 | Baranauskas | H03H 11/0433 330/109 |
| 2010/0322440 A1 | 12/2010 | Chiu et al. | |
| 2011/0115561 A1 * | 5/2011 | Kumar | H03F 1/0266 330/253 |
| 2011/0279181 A1 | 11/2011 | Fan | |
| 2017/0250663 A1 * | 8/2017 | Nakao | H03F 3/45233 |
| 2018/0301896 A1 | 10/2018 | Faingersh et al. | |

OTHER PUBLICATIONS

Shen, L., et al., "A 1-V 0.25-μW Inverter Stacking Amplifier With 1.07 Noise Efficiency Factor", IEEE Journal of Solid-State Circuits, vol. 53, No. 3, Mar. 2018, pp. 896-905.

Zhang, F., et al., "Design of Ultra-Low Power Biopotential Amplifiers for Biosignal Acquisition Applications", IEEE Transactions on Biomedical Circuits and Systems, vol. 6, No. 4, Aug. 2012, pp. 344-355.

Song, S., et al., "A Low-Voltage Chopper-Stabilized Amplifier for Fetal ECG Monitoring With a 1.41 Power Efficiency Factor", IEEE Transactions on Biomedical Circuits and Systems, vol. 9, No. 2, Apr. 2015, pp. 237-247.

Yaul, F., et al., "A Noise-Efficient 36 nV/ √Hz Chopper Amplifier Using an Inverter-Based 0.2-V Supply Input Stage", IEEE Journal of Solid-State Circuits, vol. 52, No. 11, Nov. 2017, pp. 3032-3042.

Johnson, B., et al., "An Orthogonal Current-Reuse Amplifier for Multi-Channel Sensing" IEEE Journal of Solid-State Circuits, vol. 48, No. 6, Jun. 2013, pp. 1487-1496.

Muller, R., et al., "A 0.013 mm$^2$, 5 μW, DC-Coupled Neural Signal Acquisition IC With 0.5 V Supply", IEEE Journal of Solid-State Circuits, vol. 47, No. 1, Jan. 2012, pp. 232-243.

Lopez, C., et al., "A Neural Probe With Up to 966 Electrodes and Up to 384 Configurable Channels in 0.13 μm SOI CMOS", IEEE Transactions on Biomedical Circuits and Systems, vol. 11, No. 3, Jun. 2017, pp. 510-522.

Chandrakumar, H., et al., "An 80-mV$_{pp}$ Linear-Input Range, 1.6-GΩ Input Impedance, Low-Power Chopper Amplifier for Closed-Loop Neural Recording That Is Tolerant to 650-mV$_{pp}$ Common-Mode Interference", IEEE Journal of Solid-State Circuits, vol. 52, No. 11, Nov. 2017, pp. 2811-2828.

Helleputte, N., et al., "A 345 μW Multi-Sensor Biomedical SoC With Bio-Impedance, 3-Channel ECG, Motion Artifact Reduction, and Integrated DSP", IEEE Journal of Solid-State Circuits, vol. 50, No. 1, Jan. 2015, pp. 230-244.

Communication dated Nov. 24, 2020 issued by the European Patent Office in European Application No. 20180454.9.

* cited by examiner

AMPLIFIER

CROSS-REFERENCE TO RELATED APPLICATION

This application claims priority from Korean Patent Application No. 10-2019-0092654, filed on Jul. 30, 2019, in the Korean Intellectual Property Office, the disclosure of which is incorporated herein in its entirety by reference.

BACKGROUND

1. Field

The disclosure relates to an amplifier.

2. Description of Related Art

An amplifier is mounted on an electronic device to amplify a voice signal, a bio signal, and the like. Depending on an application to which the amplifier is applied, the required noise level and bandwidth may vary. For example, amplification of a signal from a speaker's speech recognition piezo microphone array requires noise of 1 µV or less and a bandwidth of 20 kHz or more.

In the related art, a current-reuse amplifier capable of effectively reusing current has been used. However, since the current-reuse amplifier stacks a plurality of transistors to form an amplifier, high power needs to be applied to the amplifier. As higher power is applied to the amplifier, power consumption of the amplifier increases.

Therefore, there is a need for research into an amplifier operating at low noise and low power.

SUMMARY

Provided is an amplifier. Additional aspects will be set forth in part in the description which follows and, in part, will be apparent from the description, or may be learned by practice of the presented embodiments.

According to an aspect of the disclosure, there is provided an amplifier comprising: a first input transistor having a first gate connected to a first input, a first connection line connected to a first output, and a second connection line connected to a power source or a ground; a second input transistor having a second gate connected to a second input, a third connection line connected to a second output, and a fourth connection line connected to the power source or the ground; a first replica transistor having a third gate connected to the first input, a fifth connection line connected to a detection node, and a sixth connection line connected to the power source or the ground; a second replica transistor having a fourth gate connected to the second input, a seventh connection line connected to the detection node, and an eighth connection line connected to the power source or the ground; and a bias transistor having a fifth gate connected to a bias voltage, a ninth connection line connected to the detection node, and a tenth connection line connected to the power source or the ground.

The first replica transistor may be configured to replicate a configuration of the first input transistor, and the second replica transistor is configured to replicate a configuration of the second input transistor.

The amplifier may further comprise: a bias control circuit connected to the detection node, the first input, and the second input, wherein the bias control circuit may be configured to adjust input values of the first input and the second input based on a detection voltage of the detection node.

The bias control circuit may be further configured to feed back the input values of the first input and the second input such that the detection voltage of the detection node corresponds to a target voltage.

The amplifier may further comprise: an active load connected to the bias control circuit, wherein the detection voltage may be corrected by changing a resistance value of the active load until the detection voltage of the detection node corresponds to the target voltage.

The resistance value of the active load may be determined based on a voltage applied from the bias control circuit to the active load.

The first input transistor may comprise n individual transistors, the second input transistor may comprise m individual transistors, each of the first replica transistor and the second replica transistor may comprise n and m individual transistors, and n and m are natural numbers.

The amplifier may further comprise: an external input; a first capacitor connecting the external input to the first input; and a second capacitor connecting the external input to the second input, wherein the first input and the second input may be separated from the external input by the first capacitor and the second capacitor.

The amplifier may have noise of 1 µV or less and a bandwidth of 20 kHz or more.

The first and second inputs may be internal to the amplifier.

The first replica transistor and the first input transistor may have a same channel width to channel length ratio, and the second replica transistor and the second input transistor may have a same channel width to channel length ratio.

The first replica transistor may be configured to replicate a current flowing through the first input transistor at a certain ratio, and the second replica transistor may configured to replicate a current flowing through the second input transistor at a certain ratio.

According to another aspect of the disclosure, there is provided an amplifier comprising: a first input transistor having a first gate connected to a first input, a first drain connected to a first output, and a first source connected to a power source; a second input transistor having a second gate connected to a second input, a second drain connected to a second output, and a second source connected to the power source; a first replica transistor having a third gate connected to the first input, a third drain connected to a detection node, and a third source connected to the power source; a second replica transistor having a fourth gate connected to the second input, a fourth drain connected to the detection node, and a fourth source connected to the power source; and a bias transistor having a fifth gate connected to a bias voltage, a fifth drain connected to the detection node, and a fifth source connected to a ground.

The first and second inputs may be internal to the amplifier.

The first replica transistor and the first input transistor may have a same channel width to channel length ratio, and the second replica transistor and the second input transistor may have a same channel width to channel length ratio.

The first replica transistor may be configured to replicate a current flowing through the first input transistor at a certain ratio, and the second replica transistor may be configured to replicate a current flowing through the second input transistor at a certain ratio.

According to another aspect of the disclosure, there is provided an amplifier comprising: a first input transistor having a first gate connected to a first input, a first drain connected to a first output, and a first source connected to a ground; a second input transistor having a second gate connected to a second input, a second drain connected to a second output, and a second source connected to the ground; a first replica transistor having a third gate connected to the first input, a third drain connected to a detection node, and a third source connected to the ground; a second replica transistor having a fourth gate connected to the second input, a fourth drain connected to the detection node, and a fourth source connected to the ground; and a bias transistor having a fifth gate connected to a bias voltage, a fifth source connected to the detection node, and a fifth drain connected to a power source.

The first and second inputs may be internal to the amplifier.

The first replica transistor and the first input transistor may have a same channel width to channel length ratio, and the second replica transistor and the second input transistor may have a same channel width to channel length ratio.

The first replica transistor may be configured to replicate a current flowing through the first input transistor at a certain ratio, and the second replica transistor may be configured to replicate a current flowing through the second input transistor at a certain ratio.

According to another aspect of the disclosure, there is provided a method of operating an amplifier comprising: obtaining a detection voltage or a detection current at a detection node of the amplifier; adjusting input values of a first internal input and a second internal input of the amplifier based on the obtained detection current or the obtained detection voltage; and feeding back the adjusted input values of the first internal input and the second internal input as the input values of the amplifier such that the obtained detection current or the detection voltage corresponds to a target voltage or a target current, wherein the detection voltage or the detection current of the detection node is determined by drain currents of a first replica transistor and a second replica transistor of the amplifier.

BRIEF DESCRIPTION OF THE DRAWINGS

The above and/or other aspects, features, and advantages of certain embodiments of the disclosure will be more apparent from the following description taken in conjunction with the accompanying drawings, in which.

DETAILED DESCRIPTION

Figure 1A:
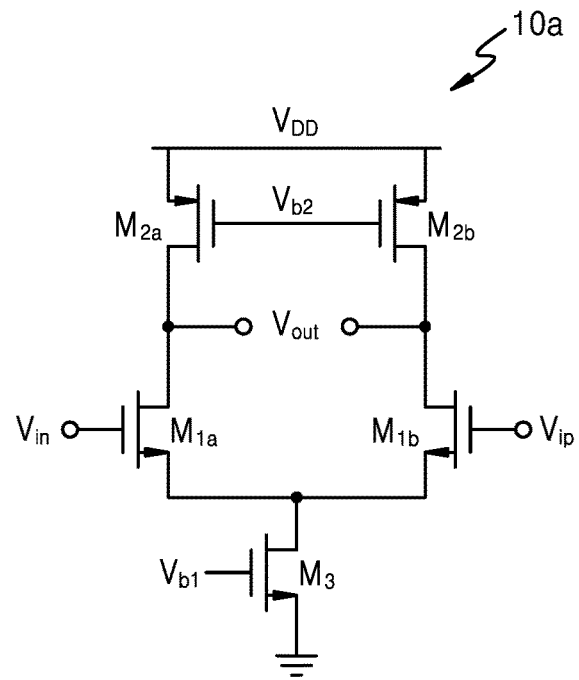
FIGS. 1A and 1B are schematic views of an amplifier according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

General and widely used terms have been employed herein and may vary according to an intention of one of ordinary skill in the art, a precedent, or emergence of new technologies. Additionally, in some cases, the disclosure may arbitrarily select specific terms, in which case, the disclosure will provide the meaning of the terms in the description of the embodiments. Accordingly, it will be understood that the terms used herein should be interpreted as having a meaning that is consistent with their meaning in the context of the relevant art and will not be interpreted in an idealized or overly formal sense unless expressly so defined herein.

Throughout the disclosure, when a portion "includes" an element, another element may be further included, rather than excluding the existence of the other element, unless otherwise described. In addition, terms such as ". . . unit", ". . . module", or the like refer to units that perform at least one function or operation, and the units may be implemented as hardware or software or as a combination of hardware and software.

Hereinafter, embodiments will be described in detail with reference to the accompanying drawings.

Figure 1B:
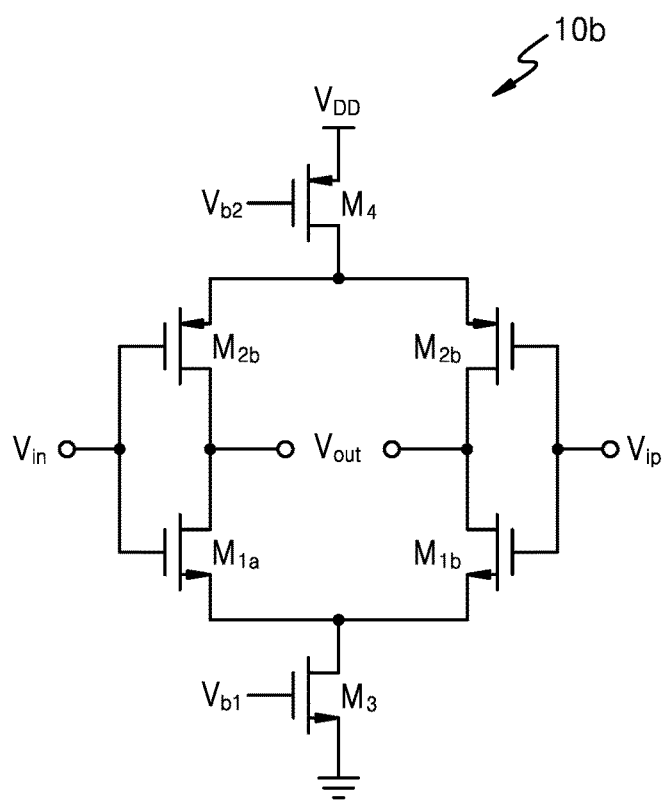

FIGS. 1A and 1B are schematic views of an amplifier according to an example embodiment.

Referring to FIG. 1A, a basic amplifier 10a includes five transistors $M_{1a}$, $M_{1b}$, $M_{2a}$, $M_{2b}$, and $M_3$. In FIG. 1A, the transistors $M_{1a}$, $M_{1b}$, and $M_3$ are NMOS transistors, and the transistors $M_{2a}$ and $M_{2b}$ are PMOS transistors.

The transistor $M_{1a}$ includes a gate connected to an input voltage $V_{in}$, a source connected to a drain of the transistor $M_3$, and a drain connected to an output voltage $V_{out}$. The transistor $M_{1b}$ includes a gate connected to a voltage $V_{ip}$, a source connected to the drain of the transistor $M_3$, and a drain connected to the output voltage $V_{out}$.

The transistor $M_{2a}$ includes a gate connected to a bias voltage $V_{b2}$, a source connected to a voltage $V_{DD}$, and a drain connected to the output voltage $V_{out}$. The transistor $M_{2b}$ includes the gate connected to bias voltage $V_{b2}$, the source connected to the voltage $V_{DD}$, and the drain connected to the output voltage $V_{out}$.

The transistor $M_3$ is a bias transistor and includes a gate connected to a bias voltage $V_{b1}$, a drain connected to sources of the transistors $M_{1a}$ and $M_{1b}$, and a grounded source. The basic amplifier 10a is biased by a tail current flowing through the transistor $M_3$.

FIG. 1B is a schematic view of a current-reuse amplifier 10b, which includes six transistors $M_{1a}$, $M_{1b}$, $M_{2a}$, $M_{2b}$, $M_3$, and $M_4$. The current-reuse amplifier 10b reuses a current used by the transistors $M_{1a}$ and $M_{1b}$ at the transistors $M_{2a}$ and $M_{2b}$.

The current-reuse amplifier 10b may obtain about twice as much gain as the basic amplifier 10a. This is because the basic amplifier 10a uses two transistors $M_{1a}$ and $M_{1b}$ as input transistors, but the current-reuse amplifier 10b uses four transistors $M_{1a}$, $M_{1b}$, $M_{2a}$, and $M_{2b}$ as input transistors.

The current-reuse amplifier 10b is a stack of more transistors while maintaining a basic structure of an amplifier. The current-reuse amplifier 10b may effectively reuse a current, but higher voltage $V_{DD}$ needs to be applied to an amplifier because many transistors are stacked to form the amplifier. The higher the voltage $V_{DD}$ used in the amplifier, the higher the power consumption.

Figure 2:
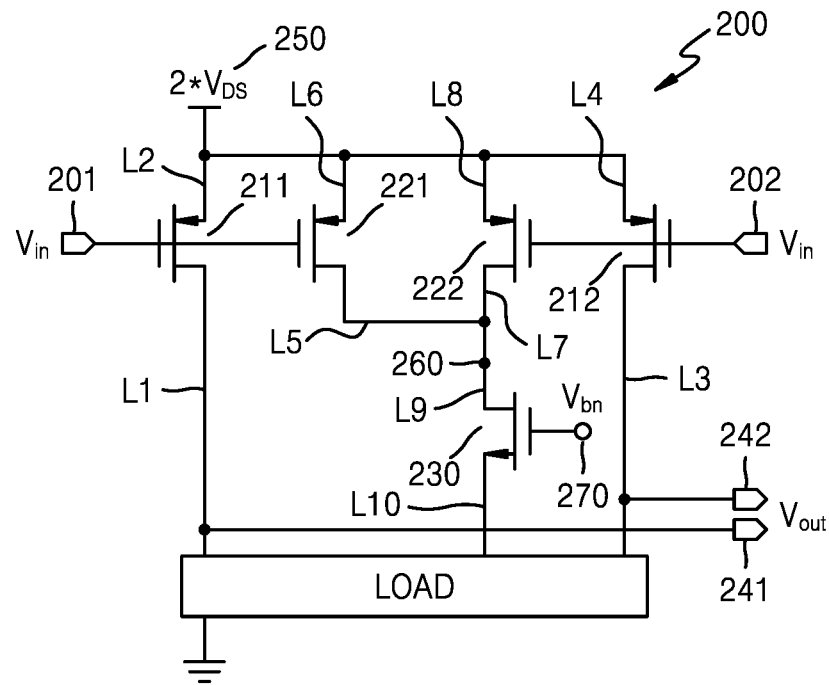
FIG. 2 is a schematic view of an amplifier including a replica transistor according to an example embodiment.

FIG. 2 is a schematic view of an amplifier including a replica transistor according to an embodiment.

Referring to FIG. 2, the amplifier 200 includes internal inputs 201 and 202, input transistors 211 and 212, replica transistors 221 and 222, a bias transistor 230, outputs 241 and 242, and a power source 250.

Each of the input transistors 211 and 212, the replica transistors 221 and 222, and the bias transistor 230 of FIG. 2 may include NMOS or PMOS transistors. According to another embodiment, it will be understood by one of ordinary skill in the art that various combinations of NMOS or PMOS transistors forming the input transistors 211 and 212, the replica transistors 221 and 222, and the bias transistor 230 may be configured.

The first input transistor 211 may have a gate connected to the first internal input 201, a first connection line L1 connected to the first output 241, and a second connection line L2 connected to the power source 250. According to an embodiment, the power source 250 may be $2*V_{DS}$.

The second input transistor 212 may have a gate connected to the second internal input 202, a third connection line L3 connected to the second output 242, and a fourth connection line L4 connected to the power source 250.

The first replica transistor 221 may have a gate connected to the first internal input 201, a fifth connection line L5 connected to a detection node 260, and a sixth connection line L6 connected to the power source 250.

The second replica transistor 222 may have the gate connected to the second internal input 202, the seventh connection line L7 connected to a detection node 260, and the eighth connection line L8 connected to the power source 250.

The bias transistor 230 may have a gate connected to a bias voltage 270, a ninth connection line L9 connected to the detection node 260, and a tenth connection line L10 connected to a ground. According to an example embodiment, a load may be connected to the first connection line L1, the third connection line L3, and the tenth connection line L10. According to another example embodiment, the load may not be provided.

A circuit diagram of the amplifier 200 may vary depending on whether each of the first input transistor 211, the second input transistor 212, the first replica transistor 221, the second replica transistor 222, and the bias transistor 230 includes a MOSFET transistor of NMOS or PMOS transistors.

FIG. 2 shows the amplifier 200 in which the first input transistor 211, the second input transistor 212, the first replica transistor 221, and the second replica transistor 222 include PMOS transistors, and the bias transistor 230 includes an NMOS transistor. Hereinafter, the amplifier 200 will be described based on the type of each transistor illustrated in FIG. 2.

The first input transistor 211 may have a gate connected to the first internal input 201, a drain connected to the first output 241, and a source connected to the power source 250.

The second input transistor 212 may have a gate connected to the second internal input 202, a drain connected to the second output 242, and a source connected to the power source 250.

The first replica transistor 211 may have a gate connected to the first internal input 201, a drain connected to the detection node 260, and a source connected to the power source 250.

The second replica transistor 222 may have a gate connected to the second internal input 202, a drain connected to the detection node 260, and a source connected to the power source 250.

The bias transistor 230 may have a gate connected to the bias voltage 270, a drain connected to the detection node 260, and a grounded source.

The first replica transistor 221 is a transistor that replicates the configuration of the first input transistor 211. In an example embodiment, the first replica transistor 221 may include the same type of MOSFET transistor (NMOS or PMOS) as the first input transistor 211. In addition, the first replica transistor 221 may have the same channel width to channel length ratio as the first input transistor 211. The first replica transistor 221 may replicate a current flowing through the first input transistor 211 at a certain ratio.

The second replica transistor 222 is a transistor that replicates the configuration of the second input transistor 212. In an embodiment, the second replica transistor 222 may include the same type of MOSFET transistor (NMOS or PMOS) as the second input transistor 212. In addition, the second replica transistor 222 may have the same channel width to channel length ratio as the second input transistor 212. The second replica transistor 222 may replicate a current flowing through the second input transistor 212 at a certain ratio.

The detection node 260 may be connected to a drain of the first replica transistor 221 and a drain of the second replica transistor 222. In addition, the detection node 260 may be connected to the bias transistor 230.

That is, a detection voltage of the detection node 260 may be determined by drain currents of the first replica transistor 221 and the second replica transistor 222. According to another embodiment, a detection current of the detection node 260 may be determined by drain currents of the first replica transistor 221 and the second replica transistor 222. In addition, a common component of the drain currents of the first replica transistor 221 and the second replica transistor 222 may be used as a bias.

The bias transistor 230 operates the amplifier 200 in a stable state, and stability of the amplifier 200 by the bias transistor 230 may be determined based on the detection voltage of the detection node 260. For example, when the detection voltage of the detection node 260 corresponds to a target voltage, the amplifier 200 may operate in a stable state. According to another embodiment, the bias transistor 230 operates the amplifier 200 in a stable state, and stability of the amplifier 200 by the bias transistor 230 may be determined based on the detection current of the detection node 260. For example, when the detection current of the detection node 260 corresponds to a target current, the amplifier 200 may operate in a stable state.

The drain currents of the first replica transistor 221 and the second replica transistor 222 may be determined by the first internal input 201 connected to a gate of the first replica transistor 221 and the second internal input 202 connected to a gate of the second replica transistor 222, respectively. That is, since the detection voltage of the detection node 260 is determined by the drain currents of the first replica transistor 221 and the second replica transistor 222, the detection voltage of the detection node 260 may be changed by adjusting input values of the first internal input 201 and the second internal input 202. That is, since the detection current of the detection node 260 is determined by the drain currents of the first replica transistor 221 and the second replica transistor 222, the detection current of the detection node 260 may be changed by adjusting input values of the first internal input 201 and the second internal input 202.

As described above, since the amplifier 200 operates in a stable state when the detection voltage of the detection node 260 corresponds to the target voltage, when the detection voltage of the detection node 260 is different from the target voltage, it is necessary to adjust the input values of the first internal input 201 and the second internal input 202. As described above, since the amplifier 200 operates in a stable state when the detection current of the detection node 260 corresponds to the target current, when the detection current of the detection node 260 is different from the target current, it is necessary to adjust the input values of the first internal input 201 and the second internal input 202.

The detection node 260 may be connected to a bias control circuit. Also, the bias control circuit may be connected to the first internal input 201 and the second internal input 202.

The bias control circuit may adjust the input values of the first internal input 201 and the second internal input 202 based on the detection voltage of the detection node 260. In an embodiment, the bias control circuit may feedback the input values of the first internal input 201 and the second internal input 202 such that the detection voltage of the detection node 260 corresponds to the target voltage. According to another embodiment, the bias control circuit may adjust the input values of the first internal input 201 and the second internal input 202 based on the current of the detection node 260. In an embodiment, the bias control circuit may feedback the input values of the first internal input 201 and the second internal input 202 such that the detection current of the detection node 260 corresponds to the target current.

For example, when a target voltage of the detection node 260 is 0.5 V and the detection voltage is 0.3 V, the bias control circuit may reduce the input values of the first internal input 201 and the second internal input 202.

The amplifier 200 of FIG. 2 includes the first input transistor 211, the second input transistor 212, the first replica transistor 221, and the second replica transistor 222. However, In another embodiment, each of the first input transistor 211, the second input transistor 212, the first replica transistor 221, and the second replica transistor 222 may include a plurality of individual transistors.

For example, when the first input transistor 211 includes n individual transistors (n is a natural number) and the second input transistor 212 includes m individual transistors (m is a natural number), each of the first replica transistor 221 and the second replica transistor 222 may include n and m individual transistors.

Figure 3:
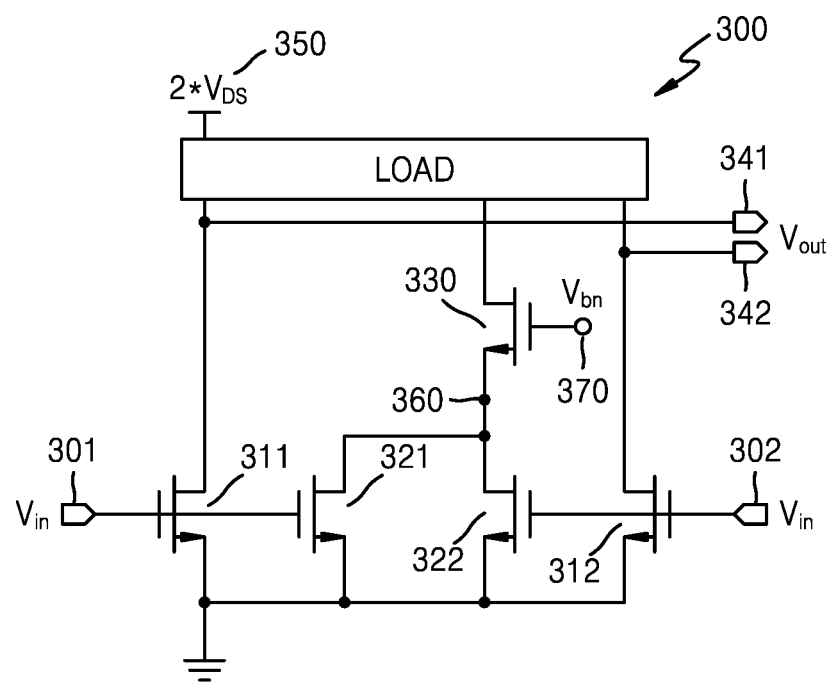
FIG. 3 is a schematic view of an amplifier including a replica transistor according to an example embodiment.

FIG. 3 is a schematic view of an amplifier including a replica transistor according to another example embodiment.

FIG. 3 shows an amplifier 300 in which a first input transistor 311, a second input transistor 312, a first replica transistor 321, a second replica transistor 322 include NMOS transistors, and a bias transistor 330 includes a PMOS transistor. Hereinafter, the amplifier 300 will be described based on the type of each transistor illustrated in FIG. 3.

The first input transistor 311 may have a gate connected to a first internal input 301, a drain connected to a first output 341, and a grounded source.

The second input transistor 312 may have a gate connected to a second internal input 302, a drain connected to a second output 342, and a grounded source.

The first replica transistor 211 may have a gate connected to the first internal input 301, a drain connected to a detection node 360, and a grounded source.

The second replica transistor 322 may have a gate connected to the second internal input 302, a drain connected to the detection node 360, and a grounded source.

The bias transistor 330 may have a gate connected to a bias voltage 370, a drain connected to the detection node 360, and a drain connected to a power source 350. According to an example embodiment, the drain is connected to the power source through a load. According to another example embodiment, the load may not be provided.

The first replica transistor 321 is a transistor that replicates the configuration of the first input transistor 311. In an embodiment, the first replica transistor 321 may include the same type of MOSFET transistor (NMOS or PMOS) as the first input transistor 311. In addition, the first replica transistor 321 may have the same channel width to channel length ratio as the first input transistor 311. The first replica transistor 321 may replicate a current flowing through the first input transistor 311 at a certain ratio.

The second replica transistor 322 is a transistor that replicates the configuration of the second input transistor 312. In an embodiment, the second replica transistor 322 may include the same type of MOSFET transistor (NMOS or PMOS) as the second input transistor 312. In addition, the second replica transistor 322 may have the same channel width to channel length ratio as the second input transistor 312. The second replica transistor 322 may replicate a current flowing through the second input transistor 312 at a certain ratio.

The detection node 360 may be connected to the drain of the first replica transistor 321 and the drain of the second replica transistor 322. In addition, the detection node 360 may be connected to the bias transistor 330.

That is, a detection voltage of the detection node 360 may be determined by drain currents of the first replica transistor 321 and the second replica transistor 322. According to another example embodiment, a detection current of the detection node 360 may be determined by drain currents of the first replica transistor 321 and the second replica transistor 322. In addition, a common component of the drain currents of the first replica transistor 321 and the second replica transistor 322 may be used as a bias.

The bias transistor 330 operates the amplifier 300 in a stable state, and stability of the amplifier 300 by the bias transistor 330 may be determined based on the detection voltage of the detection node 360. For example, when the detection voltage of the detection node 360 corresponds to a target voltage, the amplifier 300 may operate in a stable state. According to another example embodiment, the bias transistor 330 operates the amplifier 300 in a stable state, and stability of the amplifier 300 by the bias transistor 330 may be determined based on the detection current of the detection node 360. For example, when the detection current of the detection node 360 corresponds to a target current, the amplifier 300 may operate in a stable state.

The drain currents of the first replica transistor 321 and the second replica transistor 322 may be determined by the first internal input 301 connected to a gate of the first replica transistor 321 and the second internal input 302 connected to a gate of the second replica transistor 322, respectively. That is, since the detection voltage of the detection node 360 is determined by the drain currents of the first replica transistor 321 and the second replica transistor 322, the detection voltage of the detection node 360 may be changed by adjusting input values of the first internal input 301 and the second internal input 302. According to another example embodiment, That is, since the detection current of the detection node 360 is determined by the drain currents of the first replica transistor 321 and the second replica transistor 322, the detection current of the detection node 360 may be changed by adjusting input values of the first internal input 301 and the second internal input 302.

The detection node 360 may be connected to a bias control circuit. Also, the bias control circuit may be connected to the first internal input 301 and the second internal input 302.

The bias control circuit may adjust the input values of the first internal input 301 and the second internal input 302 based on the detection voltage (or detection current) of the detection node 360. In an example embodiment, the bias control circuit may feedback the input values of the first internal input 301 and the second internal input 302 such that the detection voltage of the detection node 360 corresponds to the target voltage. According to another example embodiment, the bias control circuit may feedback the input values of the first internal input 301 and the second internal input 302 such that the detection current of the detection node 360 corresponds to the target current.

For example, when a target voltage of the detection node 360 is 0.5 V and the detection voltage is 0.3 V, the bias control circuit may reduce the input values of the first internal input 301 and the second internal input 302.

Figure 4:
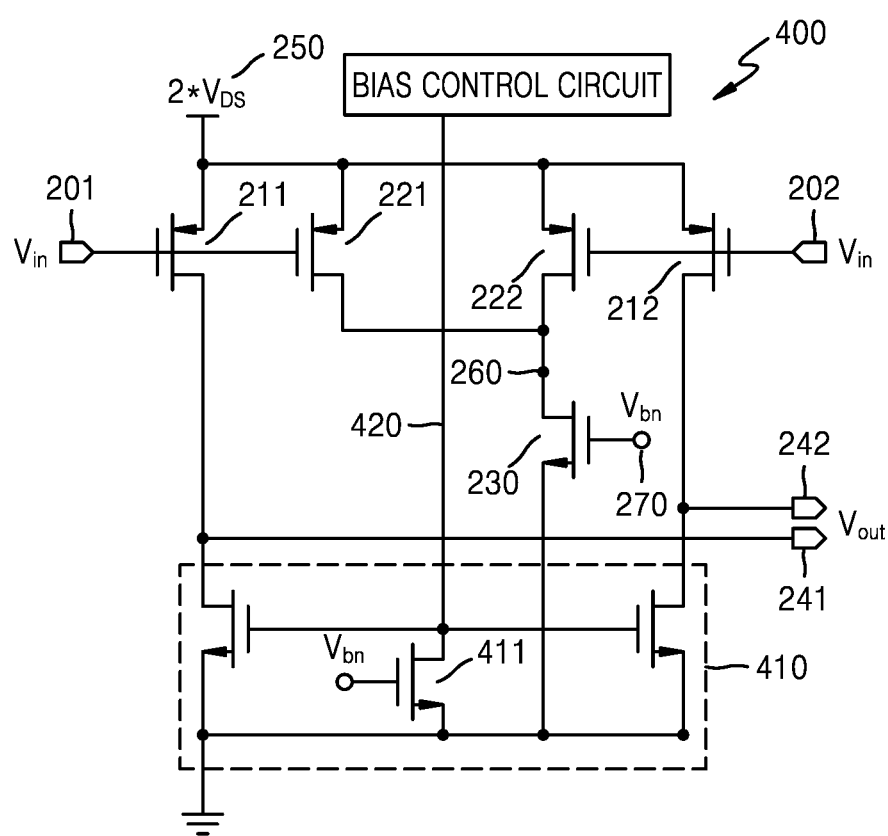
FIG. 4 is a schematic view of an amplifier including an active load according to an embodiment.

FIG. 4 is a schematic view of an amplifier including an active load according to an example embodiment.

FIG. 4 shows an amplifier 400 in which the first input transistor 211, the second input transistor 212, the first replica transistor 221, and the second replica transistor 222 include PMOS transistors, and the bias transistor 230 includes an NMOS transistor.

The first input transistor 211 may have a gate connected to the first internal input 201, a drain connected to the first output 241, and a source connected to the power source 250.

The second input transistor 212 may have a gate connected to the second internal input 202, a drain connected to the second output 242, and a source connected to the power source 250.

The first replica transistor 211 may have a gate connected to the first internal input 201, a drain connected to the first output 260, and a source connected to the power source 250.

The second replica transistor 222 may have a gate connected to the second internal input 202, a drain connected to the detection node 260, and a source connected to the power source 250.

The bias transistor 230 may have a gate connected to the bias voltage 270, a drain connected to the detection node 260, and a grounded source.

The detection node 260 may be connected to a bias control circuit. Also, the bias control circuit may be connected to the first internal input 201 and the second internal input 202.

The bias control circuit may adjust the input values of the first internal input 201 and the second internal input 202 based on the detection voltage (or detection current) of the detection node 260. In an embodiment, the bias control circuit may feedback the input values of the first internal input 201 and the second internal input 202 such that the detection voltage (or detection current) of the detection node 260 corresponds to the target voltage (or target current).

For example, when a target voltage of the detection node 260 is 0.5 V and the detection voltage is 0.3 V, the bias control circuit may reduce the input values of the first internal input 201 and the second internal input 202.

In an example embodiment, the amplifier 400 may include an active load 410. A resistance value of the active load 410 may be changed by a current applied to the active load 410. According to another example embodiment, a resistance value of the active load 410 may be changed by a voltage applied to the active load 410.

The active load 410 may be connected to the bias control circuit through a central connection line 420. The resistance value of the active load 410 may be determined based on the voltage (or current) applied from the bias control circuit to the active load 410. According to another example embodiment, the resistance value of the active load 410 may be determined based on the current applied from the bias control circuit to the active load 410.

In more detail, a transistor 411 of the active load 410 may be connected to the bias control circuit through the central connection line 420. The transistor 411 may have a gate connected to the bias voltage, a drain connected to the bias control circuit, and a grounded source. In FIG. 4, the transistor 411 includes an NMOS transistor, but may also include a PMOS transistor.

As described above in FIG. 2, since the amplifier 400 operates in a stable state when the detection voltage of the detection node 260 corresponds to the target voltage, the bias control circuit may adjust the input values of the first internal input 201 and the second internal input 202 such that the detection voltage of the detection node 260 corresponds to the target voltage. According to another embodiment, since the amplifier 400 operates in a stable state when the detection current of the detection node 260 corresponds to the target current, the bias control circuit may adjust the input values of the first internal input 201 and the second internal input 202 such that the detection current of the detection node 260 corresponds to the target current.

In addition, when the active load 410 is included in the amplifier 400, the bias control circuit adjusts the input values of the first internal input 201 and the second internal input 202, and the resistance value of the active load 410 is changed so that voltages output from the outputs 241 and 242 may be corrected.

That is, as the active load 410 is included in the amplifier 400, in order that the detection voltage of the detection node 260 corresponds to the target voltage, a voltage close to a desired voltage may be output from the outputs 241 and 242 even while the input values of the first internal input 201 and the second internal input 202 are fed back. According to another embodiment, as the active load 410 is included in the amplifier 400, in order that the detection current of the detection node 260 corresponds to the target current, a voltage close to a desired voltage may be output from the outputs 241 and 242 even while the input values of the first internal input 201 and the second internal input 202 are fed back.

A circuit configuration of the active load 410 is not limited to that shown in FIG. 4. It will be understood by one of ordinary skill in the art that any structure (i.e., structure in which gain occurs) may be used as the active load 410 as long as the resistance value may be changed according to an applied voltage (or current).

Figure 5:
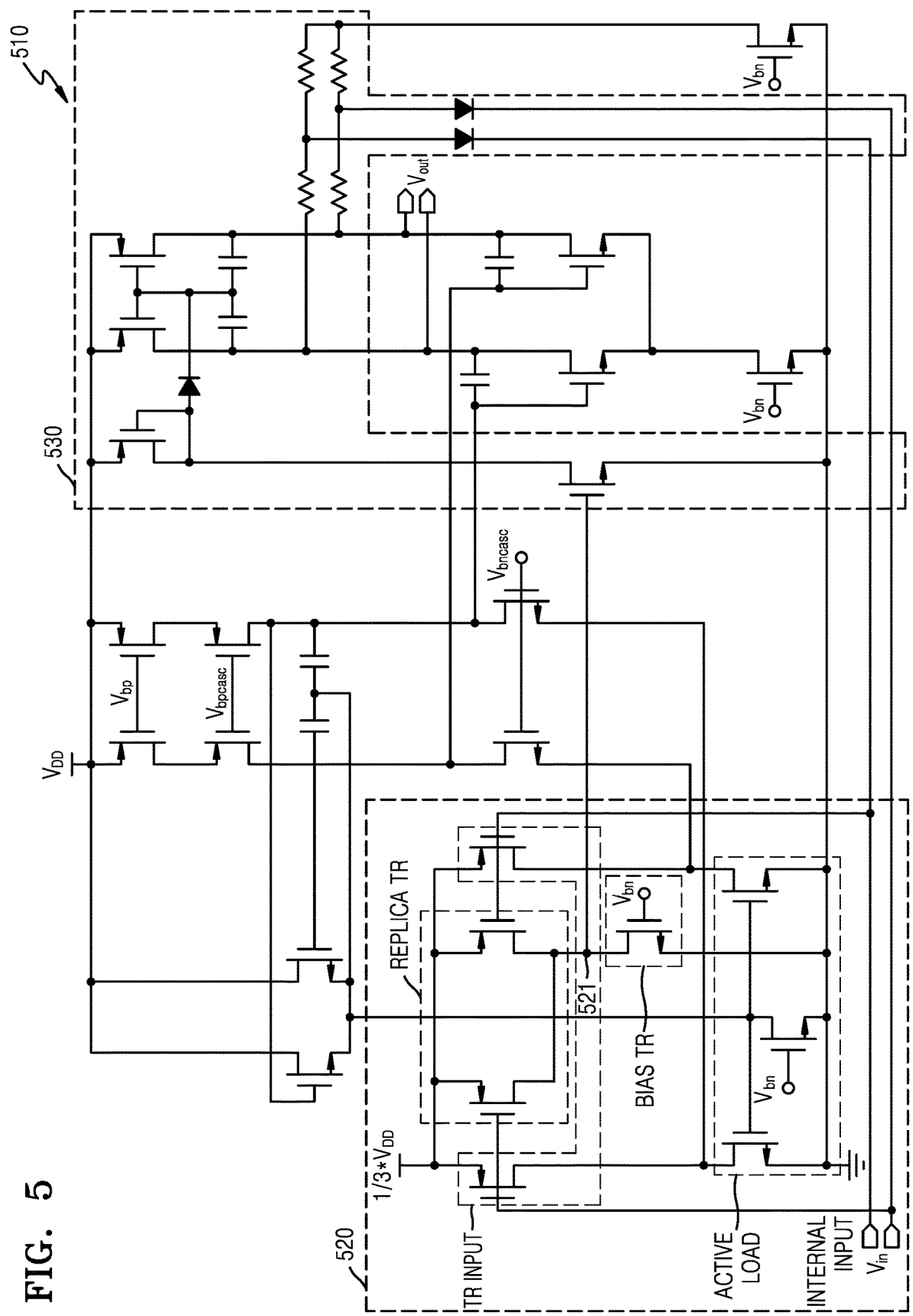
FIG. 5 is a view of an example of a circuit diagram including an amplifier and a bias control circuit according to an example embodiment.

FIG. 5 is a view of an example of a circuit diagram including an amplifier and a bias control circuit according to an example embodiment.

Referring to FIG. 5, a circuit diagram 510 includes an amplifier 520 and a bias control circuit 530. According to an embodiment, the bias control circuit 530 may refer to a circuit other than the amplifier 520 in the circuit diagram 510.

The amplifier 520 may include the internal input $V_{in}$, two input transistors, two replica transistors, and one bias transistor. The number of transistors included in the amplifier 520 is not limited to the example described above. In another embodiment, the input transistor and the replica transistor may include three or more individual transistors.

In FIG. 5, the input transistor (TR INPUT) and the replica transistor (REPLICA TR) include PMOS transistors, and the bias transistor (BIAS TR) and a transistor of an active load include NMOS transistors. However, it will be understood by one of ordinary skill in the art that various combinations of NMOS or PMOS transistors forming each transistor may be configured according to a variation of the embodiment.

The replica transistor is a transistor that replicates the configuration of the input transistor. In an embodiment, the replica transistor may include the same type of MOSFET transistor (NMOS or PMOS) as the input transistor. In addition, the replica transistor may have the same 'channel width to channel length ratio' as the input transistor. The replica transistor may replicate a current flowing through the input transistor at a certain ratio.

A detection node 521 of the amplifier 520 may be connected to a drain of the replica transistor and the bias control circuit 530.

The bias control circuit 530 may adjust an input value of the internal input based on a detection voltage of the detection node 521. In an embodiment, the bias control circuit 530 may feedback the input value of the internal input such that the detection voltage of the detection node 521 corresponds to the target voltage. According to another example embodiment, the bias control circuit 530 may adjust an input value of the internal input based on a detection current of the detection node 521. In an embodiment, the bias control circuit 530 may feedback the input value of the internal input such that the detection current of the detection node 521 corresponds to the target current.

The amplifier according to the disclosure may generate a lower level of noise and provide a sufficient bandwidth by using a replica transistor and a bias transistor instead of using a tail current. For example, the amplifier according to the disclosure may generate noise of 1 µV or less and may have a bandwidth of 20 kHz or more.

In addition, since the amplifier does not have a stacked structure of a plurality of transistors as in the current-reuse amplifier illustrated in FIG. 1B, the amplifier may lower a voltage of a power source applied to the amplifier. Accordingly, the power consumption of the amplifier may be reduced. Furthermore, the amplifier according to the disclosure generates a lower level of signal distortion.

In addition, the amplifier 520 may further include an active load. When an active load is included in the amplifier 520, in addition to adjusting the input value of the internal input, the bias control circuit may correct a voltage output from an output by changing a resistance value of the active load.

That is, as the active load is included in the amplifier 520, in order that the detection voltage of the detection node 521 corresponds to the target voltage, a voltage close to a desired voltage may be output from the output even while the input value of the internal input is fed back. According to another example embodiment, as the active load is included in the amplifier 520, in order that the detection current of the detection node 521 corresponds to the target current, a voltage close to a desired voltage may be output from the output even while the input value of the internal input is fed back.

Figure 6:
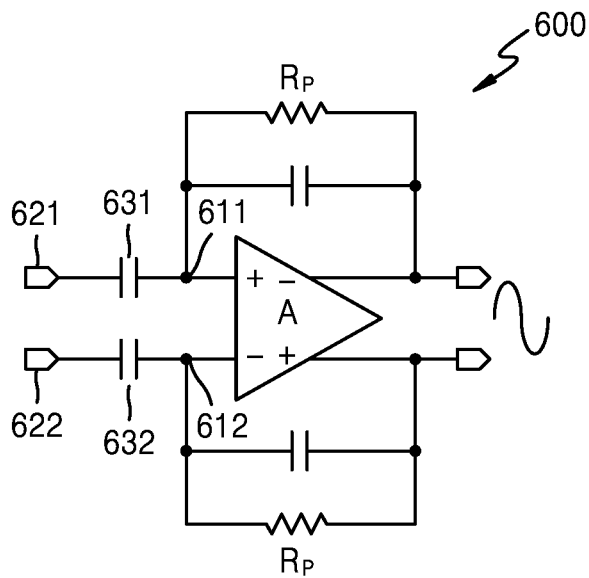
FIG. 6 is a schematic view of an example of an amplifier connected to an external power source, according to an example embodiment.

FIG. 6 is a schematic view of an example of an amplifier connected to an external power source, according to an example embodiment.

Referring to FIG. 6, an amplifier 600 has a first internal input 611 and a second internal input 612. The amplifier 600 also has a first external input 621 and a second external input 622. The first internal input 611 and the first external input 621 may be connected to each other by a first capacitor 631, and the second internal input 612 and the second external input 622 may be connected to each other by a second capacitor 632.

Due to the first capacitor 631 and the second capacitor 632, the internal inputs 611 and 612 may be independent of the external inputs 621 and 622.

As described above in FIG. 2, since the amplifier 600 operates in a stable state when the detection voltage (or detection current) of the detection node corresponds to the target voltage (or target current), a bias control circuit may adjust input values of the internal inputs 611 and 612 such that the detection voltage (or detection current) of the detection node corresponds to the target voltage (or target current).

Since the external inputs 621 and 622 are difficult to control directly, according to an example embodiment of the disclosure, the internal inputs 611 and 612 may be separated from the external inputs 621 and 622 by disposing the capacitors 631 and 632 between the external inputs 621 and 622 and the internal inputs 611 and 612.

Figure 7:
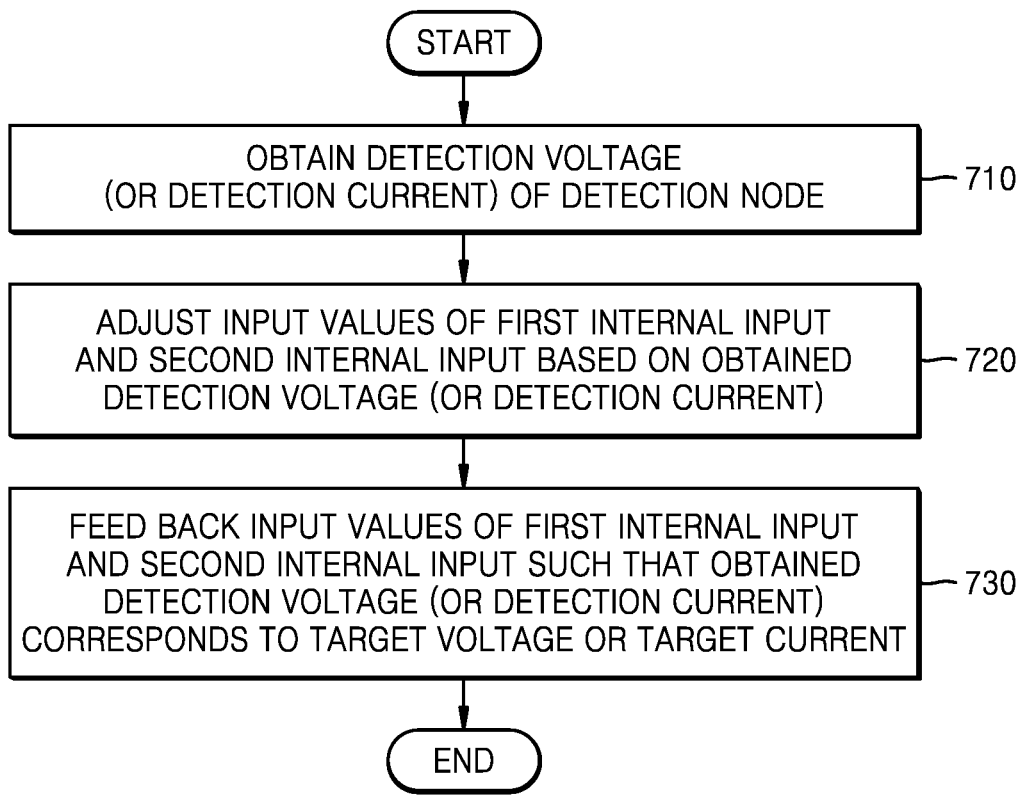
FIG. 7 is a flowchart of an operation of an amplifier according to an example embodiment.

FIG. 7 is a flowchart of an operation of an amplifier according to an embodiment.

Since information about the operation of the amplifier shown in FIG. 7 relates to the example embodiments described in the above-described drawings, the descriptions in the above-described drawings may be applied to the method of FIG. 7.

The amplifier may include a first input transistor, a second input transistor, a first replica transistor, a second replica transistor, and a bias transistor.

The first input transistor may have a gate connected to a first internal input, a first connection line connected to a first output, and a second connection line connected to or grounded to a power source. The second input transistor may have a gate connected to a second internal input, a first connection line connected to a second output, and a second connection line connected to or grounded to a power source. The first replica transistor may have a gate connected to a first internal input, a first connection line connected to a detection node, and a second connection line connected to or grounded to a power source. The second replica transistor may have a gate connected to a second internal input, a first connection line connected to a detection node, and a second connection line connected to or grounded to a power source. The bias transistor may have a gate connected to a bias voltage, a first connection line connected to a detection node, and a second connection line connected to or grounded to a power source.

A circuit diagram of the amplifier may vary depending on whether each of the first input transistor, the second input transistor, the first replica transistor, the second replica transistor, and the bias transistor includes a MOSFET transistor of an NMOS or a PMOS transistor.

Hereinafter, it is assumed that the first input transistor, the second input transistor, the first replica transistor, and the second replica transistor include PMOS transistors, and the bias transistor includes an NMOS transistor.

The amplifier may include a bias control circuit. The bias control circuit may be connected to the detection node. Also, the bias control circuit may be connected to a first internal input and a second internal input.

Referring to FIG. 7, in operation 710, the bias control circuit may obtain a detection voltage of the detection node. According to another embodiment, the bias control circuit may obtain a detection current of the detection node.

The detection node may be connected to a drain of the first replica transistor and a drain of the second replica transistor. In addition, the detection node may be connected to the bias transistor.

That is, the detection voltage of the detection node may be determined by drain currents of the first replica transistor and the second replica transistor. According to another embodiment, the detection current of the detection node may be determined by drain currents of the first replica transistor and the second replica transistor. In addition, a common component of the drain of the first replica transistor and the second replica transistor may be used as a bias.

In operation 720, the bias control circuit may adjust input values of the first internal input and the second internal input based on the obtained detection current. According to another embodiment, the bias control circuit may adjust input values of the first internal input and the second internal input based on the obtained detection voltage.

The drain currents of the first replica transistor and the second replica transistor may be determined by the first internal input connected to a gate of the first replica transistor and the second internal input connected to a gate of the second replica transistor, respectively.

That is, since the detection voltage of the detection node is determined by the drain currents of the first replica transistor and the second replica transistor, the detection voltage of the detection node may be changed by adjusting the input values of the first internal input and the second internal input based on the obtained detection voltage. According to another embodiment, since the detection current of the detection node is determined by the drain currents of the first replica transistor and the second replica transistor, the detection current of the detection node may be changed by adjusting the input values of the first internal input and the second internal input based on the obtained detection current.

In operation 730, the bias control circuit may feedback the input values of the first internal input and the second internal input such that the obtained detection current or the detection voltage corresponds to the target voltage or the target current.

For example, when the target voltage of the detection node is 0.5 V and the detection voltage is 0.3 V, the bias control circuit may feedback the input values of the first internal input and the second internal input until the detection voltage of the detection node becomes 0.5 V.

The amplifier according to the disclosure may be utilized in low power, high resolution, and low noise sensor applications. For example, the amplifier according to the disclosure may be used to amplify a voice signal output from a piezo microphone.

In addition, the amplifier according to the disclosure may be utilized in high resolution sensing multichannel applications. For example, the amplifier according to the disclosure may be used in a small bio-medical device or an implant device.

In addition, the amplifier according to the disclosure may be mounted on a wearable device, a mobile phone, Internet of Things (IoT) device, etc., and may contribute to reducing power consumption.

The amplifier according to the disclosure may generate a lower level of noise and provide a sufficient bandwidth by using a replica transistor and a bias transistor instead of using a tail current.

In addition, the amplifier according to the disclosure may operate with a low level power source, thereby reducing power consumption.

It should be understood that example embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An amplifier comprising:
   a first input transistor having a first gate connected to a first input, a first connection line connected to a first output, and a second connection line connected to a power source or a ground;
   a second input transistor having a second gate connected to a second input, a third connection line connected to a second output, and a fourth connection line connected to the power source or the ground;
   a first replica transistor having a third gate connected to the first input, a fifth connection line connected to a detection node, and a sixth connection line connected to the power source or the ground;
   a second replica transistor having a fourth gate connected to the second input, a seventh connection line connected to the detection node, and an eighth connection line connected to the power source or the ground; and
   a bias transistor having a fifth gate connected to a bias voltage, a ninth connection line connected to the detection node, and a tenth connection line connected to the power source or the ground.

2. The amplifier of claim 1, wherein the first replica transistor is configured to replicate a configuration of the first input transistor, and the second replica transistor is configured to replicate a configuration of the second input transistor.

3. The amplifier of claim 1, further comprising:
   a bias control circuit connected to the detection node, the first input, and the second input,
   wherein the bias control circuit is configured to adjust input values of the first input and the second input based on a detection voltage of the detection node.

4. The amplifier of claim 3, wherein the bias control circuit is further configured to feed back the input values of the first input and the second input such that the detection voltage of the detection node corresponds to a target voltage.

5. The amplifier of claim 4, further comprising:
   an active load connected to the bias control circuit,
   wherein the detection voltage is corrected by changing a resistance value of the active load until the detection voltage of the detection node corresponds to the target voltage.

6. The amplifier of claim 5, wherein the resistance value of the active load is determined based on a voltage applied from the bias control circuit to the active load.

7. The amplifier of claim 1, wherein the first input transistor comprises n individual transistors,
the second input transistor comprises m individual transistors,
each of the first replica transistor and the second replica transistor comprises n and m individual transistors, and
n and m are natural numbers.

8. The amplifier of claim 1, further comprising:
an external input;
a first capacitor connecting the external input to the first input; and
a second capacitor connecting the external input to the second input,
wherein the first input and the second input are separated from the external input by the first capacitor and the second capacitor.

9. The amplifier of claim 1, wherein the amplifier has noise of 1 μV or less and a bandwidth of 20 kHz or more.

10. The amplifier of claim 1, wherein the first and second inputs are internal to the amplifier.

11. The amplifier of claim 1, wherein the first replica transistor and the first input transistor have a same channel width to channel length ratio, and
the second replica transistor and the second input transistor have a same channel width to channel length ratio.

12. The amplifier of claim 1, wherein the first replica transistor is configured to replicate a current flowing through the first input transistor at a certain ratio, and
the second replica transistor is configured to replicate a current flowing through the second input transistor at a certain ratio.

13. An amplifier comprising:
a first input transistor having a first gate connected to a first input, a first drain connected to a first output, and a first source connected to a power source;
a second input transistor having a second gate connected to a second input, a second drain connected to a second output, and a second source connected to the power source;
a first replica transistor having a third gate connected to the first input, a third drain connected to a detection node, and a third source connected to the power source;
a second replica transistor having a fourth gate connected to the second input, a fourth drain connected to the detection node, and a fourth source connected to the power source; and
a bias transistor having a fifth gate connected to a bias voltage, a fifth drain connected to the detection node, and a fifth source connected to a ground.

14. The amplifier of claim 13, wherein the first and second inputs are internal to the amplifier.

15. The amplifier of claim 13, wherein the first replica transistor and the first input transistor have a same channel width to channel length ratio, and
the second replica transistor and the second input transistor have a same channel width to channel length ratio.

16. The amplifier of claim 13, wherein the first replica transistor is configured to replicate a current flowing through the first input transistor at a certain ratio, and
the second replica transistor is configured to replicate a current flowing through the second input transistor at a certain ratio.

17. An amplifier comprising:
a first input transistor having a first gate connected to a first input, a first drain connected to a first output, and a first source connected to a ground;
a second input transistor having a second gate connected to a second input, a second drain connected to a second output, and a second source connected to the ground;
a first replica transistor having a third gate connected to the first input, a third drain connected to a detection node, and a third source connected to the ground;
a second replica transistor having a fourth gate connected to the second input, a fourth drain connected to the detection node, and a fourth source connected to the ground; and
a bias transistor having a fifth gate connected to a bias voltage, a fifth source connected to the detection node, and a fifth drain connected to a power source.

18. The amplifier of claim 1, wherein the first and second inputs are internal to the amplifier.

19. The amplifier of claim 1, wherein the first replica transistor and the first input transistor have a same channel width to channel length ratio, and
the second replica transistor and the second input transistor have a same channel width to channel length ratio.

20. A method of operating an amplifier comprising:
obtaining a detection voltage or a detection current at a detection node of the amplifier;
adjusting input values of a first internal input and a second internal input of the amplifier based on the obtained detection current or the obtained detection voltage; and
feeding back the adjusted input values of the first internal input and the second internal input as the input values of the amplifier such that the obtained detection current or the detection voltage corresponds to a target voltage or a target current,
wherein the detection voltage or the detection current of the detection node is determined by drain currents of a first replica transistor and a second replica transistor of the amplifier.

* * * * *